(12) United States Patent
Kariya

(10) Patent No.: US 7,301,215 B2
(45) Date of Patent: Nov. 27, 2007

(54) PHOTOVOLTAIC DEVICE

(75) Inventor: Toshimitsu Kariya, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/464,263

(22) Filed: Aug. 14, 2006

(65) Prior Publication Data
US 2007/0040233 A1 Feb. 22, 2007

(30) Foreign Application Priority Data
Aug. 22, 2005 (JP) ............... 2005-239766

(51) Int. Cl.
*H01L 31/105* (2006.01)
(52) U.S. Cl. .............. 257/458; 257/E31.001; 257/E25.009
(58) Field of Classification Search ........ 257/458, 257/E31.001, E25.009; 136/256
See application file for complete search history.

(56) References Cited
U.S. PATENT DOCUMENTS
5,810,945 A * 9/1998 Stutzmann et al. .......... 438/96
6,331,672 B1 * 12/2001 Matsuda et al. ............ 136/256

* cited by examiner

*Primary Examiner*—Sue A. Purvis
*Assistant Examiner*—Tan Tran
(74) *Attorney, Agent, or Firm*—Fitzpatrick, Cella, Harper & Scinto

(57) ABSTRACT

A photovoltaic device includes at least a first electrode, a first-conductivity-type layer composed of non-single-crystalline silicon, a second-conductivity-type layer composed of polycrystalline silicon, a third-conductivity-type layer composed of non-single-crystalline silicon, and a second electrode, wherein the contact surface of the first electrode with respect to the first-conductivity-type layer has a shape interspersed with a plurality of projections, and the lower limit and the upper limit of the density of the projections interspersed on the surface of the first electrode satisfy the following equations, provided that the thickness of the second-conductivity-type layer is t µm:

Lower limit=$0.312 \exp(-0.60t)$ pieces/µm$^2$

Upper limit=$0.387 \exp(-0.39t)$ pieces/µm$^2$.

5 Claims, 6 Drawing Sheets

PHOTOVOLTAIC DEVICE

BACKGROUND OF THE INVENTION

1. Field of the Invention

The present invention relates to photovoltaic devices, and, more particularly, to solar cells including photoelectric conversion layers composed of polycrystalline silicon (polycrystalline silicon solar cells). The present invention also relates to a structure of a photovoltaic device in which, while preventing a decrease in the open-circuit voltage, in particular, due to the use of a texture structure in the photovoltaic device, the short-circuit current can be improved and the conversion efficiency can be improved.

2. Description of the Related Art

Since a presentation made on solar cells including photoelectric conversion layers composed of microcrystalline silicon (microcrystalline silicon solar cells) at the University of Neuchatel, Switzerland, in 1996, microcrystalline silicon solar cells have been receiving attention (refer to Material Research Society Symposium Proceedings vol. 420, 1996 "ON THE WAY TOWARDS HIGH EFFICIENCY THIN FILM SILICON SOLAR CELLS BY THE MICROMORPH CONCEPT" J. Meier, A. Shah et al. (Non-patent Document 1)). The reason for this is that use of microcrystalline silicon for photoelectric conversion layers increases the short-circuit current, and by stacking the photoelectric conversion layers together with amorphous silicon layers, a high conversion efficiency can be achieved. Furthermore, in microcrystalline silicon solar cells, the light-induced degradation phenomenon, which is a known problem in amorphous silicon, is not observed.

Herein, the term "microcrystalline silicon" means small-grain-size silicon. There are two views on the relationship between microcrystalline silicon and polycrystalline silicon. In one view, microcrystalline silicon and polycrystalline silicon are clearly differentiated. In another view, microcrystalline silicon is considered to be a type of polycrystalline silicon. The former is based on the understanding that microcrystalline silicon is a material that is not considered as an extension of the theory of polycrystalline silicon. The latter is based on the understanding that microcrystalline silicon is small-grain-size polycrystalline silicon.

In this specification and the claims, the latter view is adopted. Therefore, "polycrystalline silicon" is a concept that naturally involves "microcrystalline silicon". In this specification and the claims, "polycrystal" means an assemblage of many crystal grains. In this specification and the claims, polycrystals are defined to have an average crystal grain size of 5 nm to 100 µm. Among these, those which have an average crystal grain size of 5 nm to 5 µm are defined as microcrystals. The average crystal grain size can be determined using the Scherrer equation from the full-width at half-maximum of the (220) peak obtained by X-ray diffraction analysis.

Furthermore, Sharp Technical Journal No. 83, August 2002 "Crystalline silicon thin-film solar cells" (Non-patent Document 2) describes observations on the relationship between the irregularities of the first electrode and the open-circuit voltage (Voc), and the relationship between the irregular shape and the mechanism of grain boundary generation.

On a planar substrate, since polycrystalline silicon grows substantially perpendicular to the surface of the substrate, grain boundaries occur substantially perpendicular to the surface of the substrate. In such a case, photocarriers moving substantially perpendicular to the surface of the substrate do not substantially pass transversely across the grain boundaries. On the other hand, on an irregular substrate, since polycrystalline silicon grows substantially perpendicular to the inclined planes of the irregularities, crystal grains generated from adjacent inclined planes collide with each other, and many grain boundaries occur in random directions. In such a case, since photocarriers must pass through many such grain boundaries, the Voc and the fill factor (F.F.) decrease.

As described above, when a first electrode having a texture structure suitable for polycrystalline silicon solar cells is used, it is necessary to take crystal growth into consideration.

Japanese Patent Laid-Open No. 2002-151715 (Patent Document 1) discloses a technique in which by specifying the shape of irregularities of a first electrode, the (220) orientation of polycrystalline silicon is controlled. According to this method, tin oxide and zinc oxide are used for the first electrode, and the following measurement results are obtained: Voc 0.525 V, Jsc 22.8 mA/cm$^2$, and conversion efficiency 8.44%. However, in this method, the short-circuit current is not very large, and the light collection efficiency is not sufficient.

Furthermore, Japanese Patent Laid-Open No. 2002-299660 (Patent Document 2) discloses a technique in which the conversion efficiency is improved by specifying the angles of projections on the surface of a substrate. In this method, since the angles of polygonal-pyramid-shaped projections on the surface of a first electrode (which is described as a back electrode in the specification) range from 8° to 40°, it is possible to suppress a leakage current due to the generation of grain boundaries. However, it is assumed that the open-circuit voltage is not as high as that in the case of a planar substrate. Furthermore, since the first electrode has a surface with the projections described above and the thickness of a crystalline silicon layer (which is described as a semiconductor layer in the specification) is large, a second electrode layer (which is described as a transparent conductive layer in the specification) is planar, and thus light collection efficiency is not sufficient.

Japanese Patent No. 2771667 (Patent Document 3) discloses a technique in which projections are formed on a substrate by a laser method or a photolithographic method, amorphous silicon is deposited only on the projections, and then, using the amorphous silicon as a nucleus, a polycrystalline silicon layer is grown by thermal CVD. However, the laser method or the photolithographic method is an expensive process, which leads to an increase in the cost of the photovoltaic device.

SUMMARY OF THE INVENTION

The present invention relates to a photovoltaic device in which silicon-based thin films are disposed on a first electrode, and, more particularly, to a photovoltaic device in which a polycrystalline silicon layer is used as an i-layer (photoelectric conversion layer). The present invention provides a photovoltaic device in which, while preventing a decrease in the open-circuit voltage due to the use of a texture structure therein, the short-circuit current can be improved and the conversion efficiency can be improved.

According to the present invention, a photovoltaic device includes at least a first electrode, a first-conductivity-type layer composed of non-single-crystalline silicon, a second-conductivity-type layer composed of polycrystalline silicon, a third-conductivity-type layer composed of non-single-crystalline silicon, and a second electrode, wherein the contact surface of the first electrode with respect to the first-conductivity-type layer has a shape interspersed with a plurality of projections, and the lower limit and the upper limit of the density of the projections interspersed on the surface of the first electrode satisfy the following equations, provided that the thickness of the second-conductivity-type layer is t μm:

Lower limit=0.312 exp(−0.60t) pieces/μm²

Upper limit=0.387 exp(−0.39t) pieces/μm²

The contact surface of the third-conductivity-type layer with respect to the second electrode can have a plurality of curved convex portions.

The first electrode can include a reflection layer, a first transparent conductive layer, and a second transparent conductive layer, the second transparent conductive layer being in contact with the first-conductivity-type layer, the projections being present on the surface of the second transparent conductive layer.

The third-conductivity-type layer can include a plurality of sublayers, and among the plurality of sublayers, a sublayer in contact with the second-conductivity-type layer can be a buffer layer composed of hydrogenated amorphous silicon.

The first electrode can include a layer composed of zinc oxide formed by electrodeposition.

Further features of the present invention will become apparent from the following description of exemplary embodiments with reference to the attached drawings.

DESCRIPTION OF THE EMBODIMENTS

According to the present invention, because of improvement in the light collection efficiency of a photovoltaic device, in particular, a polycrystalline silicon solar cell, the short-circuit current density and the open-circuit voltage of the device are improved, which results in improvement in the conversion efficiency of the device.

The exemplary embodiments of the present invention will be described in detail with reference to the drawings. However, it is to be understood that the photovoltaic device of the present invention is not limited thereto.

Figure 1:
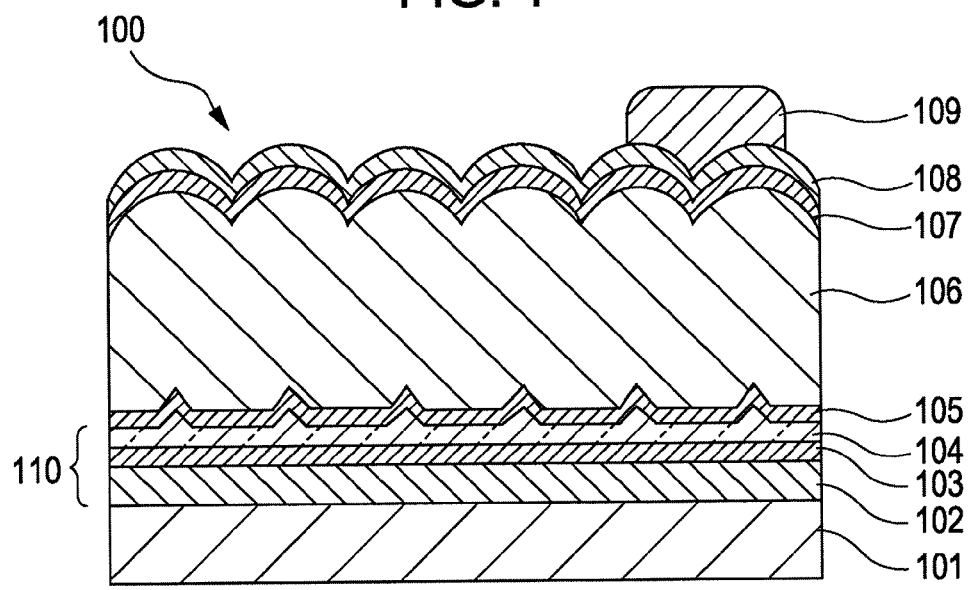
FIG. 1 is a schematic cross-sectional view showing a photovoltaic device according to an exemplary embodiment of the present invention.
Figure 2:
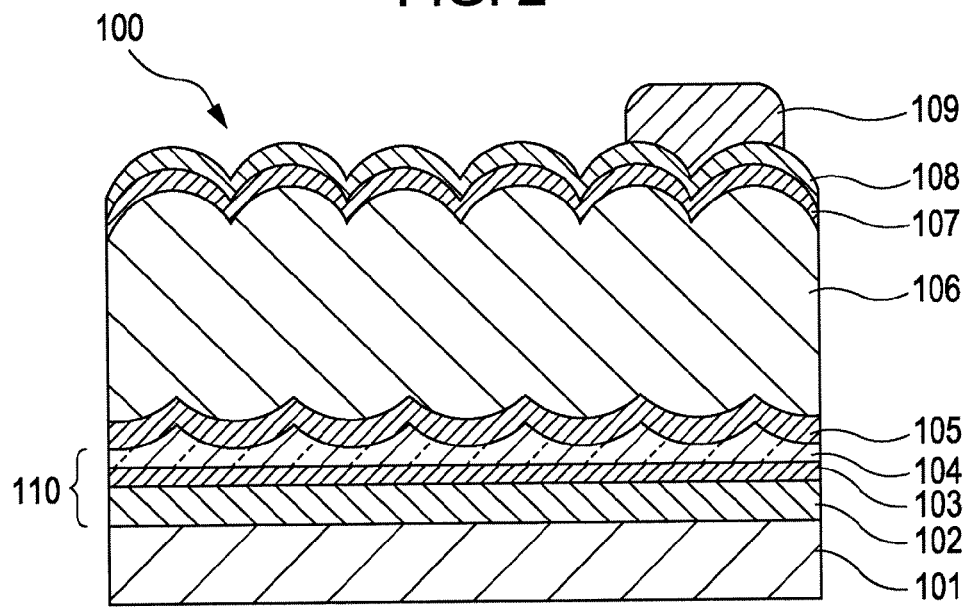
FIG. 2 is a schematic cross-sectional view showing a photovoltaic device according to another exemplary embodiment of the present invention.

FIGS. 1 and 2 are each a schematic cross-sectional view showing a photovoltaic device according to exemplary embodiments of the present invention. FIG. 1 shows an example of a photovoltaic device in which the contact surface of the first electrode with respect to the first-conductivity-type layer has a shape having a smooth face interspersed with a plurality of projections.

A photovoltaic device 100 includes a substrate 101, and a first electrode 110, a first-conductivity-type layer 105, a second-conductivity-type layer 106, a third-conductivity-type layer 107, a second electrode 108, and a collecting electrode 109 disposed in that order on the substrate 101. The first electrode 110 may be a single layer or may have a multilayer structure including a plurality of layers as shown in FIG. 1.

The individual components will be described in detail below. As the substrate 101, any material that functions as a support for the photovoltaic device 100 may be used, and for example, glass, stainless steel, a resin, or a sheet thereof can be used. Furthermore, the first electrode may partially or entirely function as a substrate. In such a case, the substrate 101 may be absent. At least a part of the first electrode 110 is composed of a material having a low resistivity that allows the first electrode 110 to function as an electrode. The surface of the first electrode in contact with the first-conductivity-type layer has a shape in which a smooth face is interspersed with a plurality of projections. Furthermore, in the exemplary embodiment shown in FIG. 1, the first electrode 110 includes a reflection layer 102 composed of a metal, such as Ag, Au, or Al, a first transparent conductive layer 103 composed of ZnO or the like, and a second transparent conductive layer 104 composed of ZnO or the like. In the exemplary embodiment shown in FIG. 1, the projections are provided on the surface of the second transparent conductive layer 104 in contact with the first-conductivity-type layer 105. In the first transparent conductive layer 103, the c-axis can be oriented substantially perpendicular to the surface of the substrate.

The reflection layer 102 and the first transparent conductive layer 103 can be formed by sputtering or the like. When the first transparent conductive layer 103 is formed by sputtering, the c-axis of the first transparent conductive layer 103 can be easily oriented substantially perpendicular to the surface of the substrate 101. On the other hand, the second transparent conductive layer 104 can be formed by electrodeposition or the like.

Figure 5:
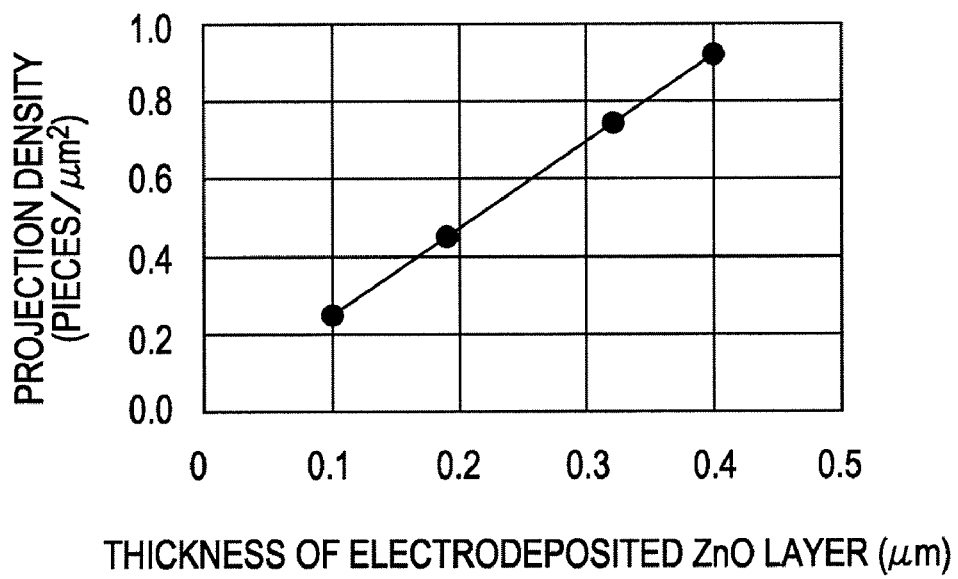
FIG. 5 is a graph showing the relationship between the thickness of a second transparent conductive layer and the projection density.

When the thickness of the second transparent conductive layer 104 is small, the projections do not grow sufficiently. When the thickness of the second transparent conductive layer 104 is large, the projections grow all over the surface, and the resulting surface is not different from that of an irregular substrate which has been conventionally used. FIG. 5 is a graph showing the relationship between the thickness of the second transparent conductive layer and the projection density. As is evident from the graph, as the thickness increases, the projection density increases. The mechanism of the increase in the projection density with the increase of the thickness is considered to be as follows.

Figure 6:
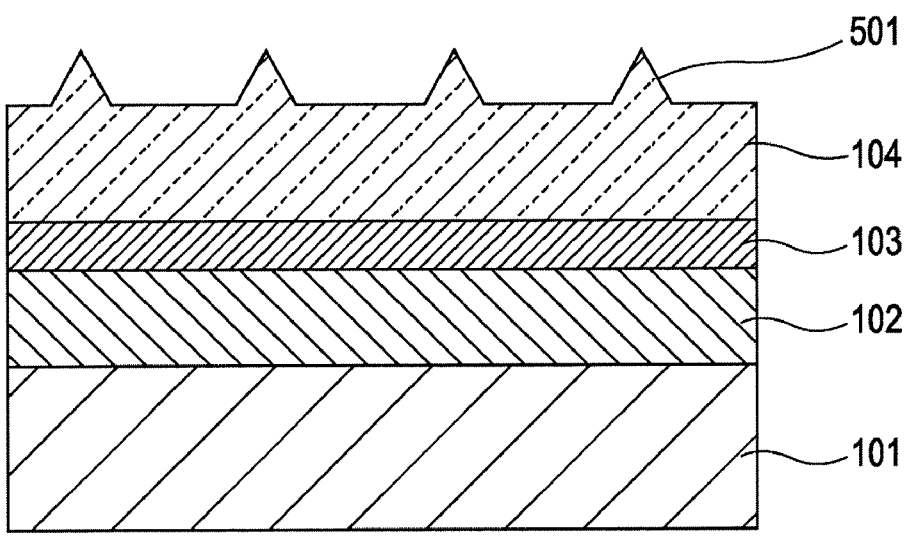
FIG. 6 is a cross-sectional view showing an example of a first electrode including a second transparent conductive layer.
Figure 7:
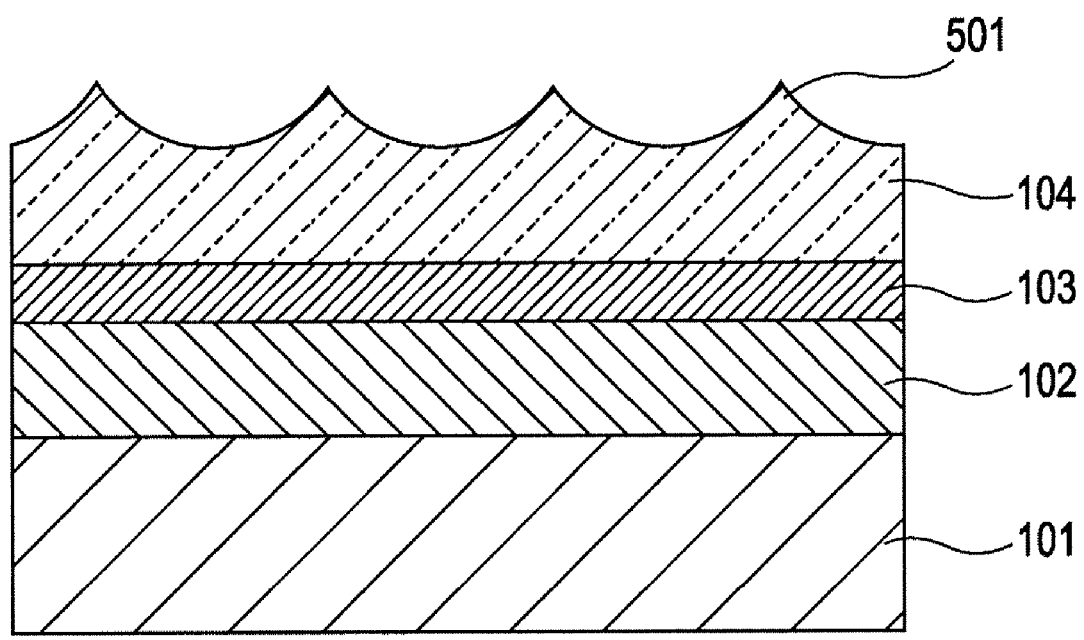
FIG. 7 is a cross-sectional view showing another example of a first electrode including a second transparent conductive layer.
Figure 8A:
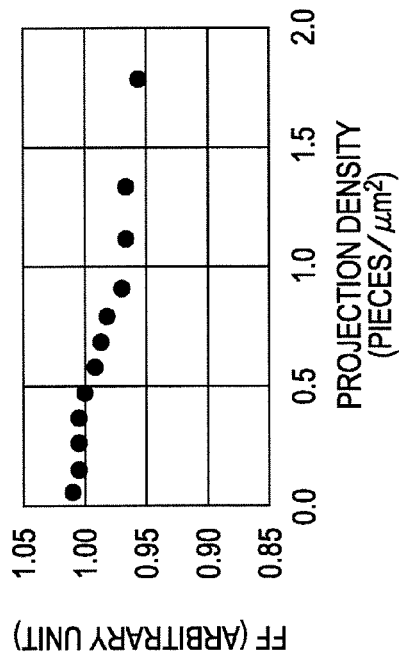
FIGS. 8A to 8D are graphs showing the relationships between the projection density and the solar cell properties.
Figure 8C:
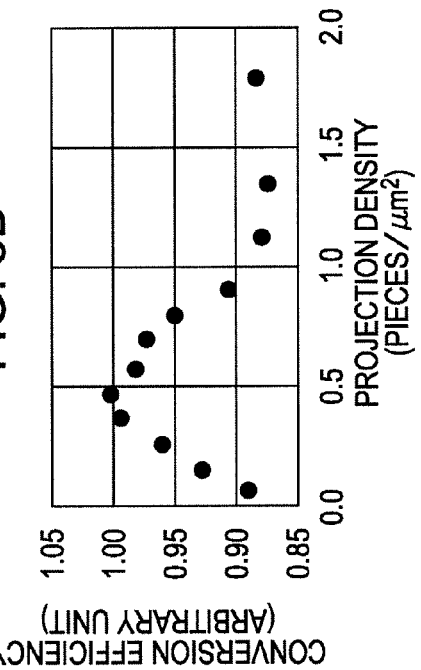
Figure 8B:
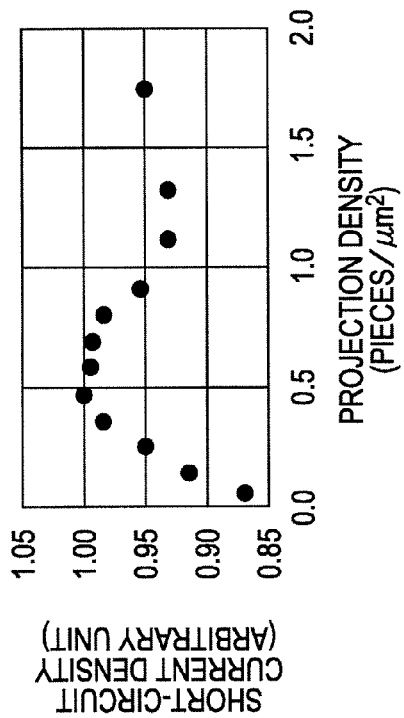
Figure 8D:
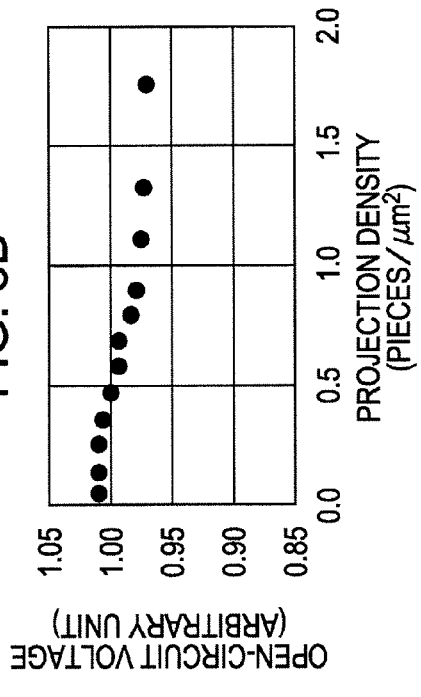

In the experimental example on the basis of which the graph in FIG. 5 has been generated, the first transparent conductive layer is formed by sputtering, and thus the c-axis is oriented substantially perpendicular to the surface of the substrate. Furthermore, in the experimental example, the second transparent conductive layer is formed by electrodeposition, and in the second transparent conductive layer, the portion closer to the first transparent conductive layer, i.e., the layer formed at the initial stage, has the same orientation as that of the first transparent conductive layer. In the meantime, as the growth of the second transparent conductive layer proceeds, nuclei having different orientations are generated, and as shown in FIGS. 6 and 7, projections 501 are formed on the surface. Therefore, as the thickness of the second transparent conductive layer increases, the projection density is considered to increase.

In order to control the projection density with high accuracy, for example, at the initial stage of forming the second transparent conductive layer, the current density is decreased to prevent the generation of nuclei so that a smooth surface is formed, and then the current density is increased to promote the generation of nuclei so that projections are formed on the surface. In this specification and the claims, the term "projection" refers to a portion protruding higher from the surrounding areas. Specifically, assuming a plane obtained by averaging the irregularities of a first electrode, the angle of the apex of a projection present in a cross section perpendicular to the plane ranges from 20 to 70 degrees. The shape of the projections can be pyramidal, conical, or the like. The height of the projections can range from one hundredth to one fifth of the thickness of the second-conductivity-type layer. The first-conductivity-type layer is composed of non-single-crystalline silicon of n- or p-conductivity type. As the non-single-crystalline silicon, hydrogenated amorphous silicon or hydrogenated polycrystalline silicon can be used. The first-conductivity-type layer may be a single layer or may have a multilayer structure including hydrogenated amorphous silicon layers or hydrogenated polycrystalline silicon layers. In order to form the layer, RF plasma CVD or VHF plasma CVD is usually used, but the formation method is not limited thereto. The thickness of the first-conductivity-type layer is usually 5 to 20 nm. Furthermore, in FIG. 1, the contact surface of the first electrode with respect to the first-conductivity-type layer has a shape having a smooth face interspersed with a plurality of projections. However, as long as the protrusions defined above are interspersed, the surface of the first electrode other than the protrusions may be nonsmooth. For example, the surface of the first electrode may have a shape having curved convex portions or curved concave portions. FIG. 2 shows an example in which the contact surface of the first electrode with respect to the first-conductivity-type layer has a shape having curved concave portions and the curved concave portions are connected to each other.

As the second-conductivity-type layer, hydrogenated polycrystalline silicon of substantially intrinsic conductivity type can be used. As the second-conductivity-type layer, hydrogenated polycrystalline silicon of p- or n-conductivity type may also be used. Since the second-conductivity-type layer is a layer that generates photocarriers, the defect level density must be sufficiently low. In order to form the layer, plasma CVD is usually used, and in particular, high-frequency plasma CVD, such as VHF plasma CVD or microwave plasma CVD, can be used. The reason for this is assumed that, at low frequencies, the ion energy in plasma is increased, ion damage on the surface of the growing layer is increased, and thus crystallization is inhibited. As described in Non-patent Document 2, hydrogenated polycrystalline silicon has a property in which crystal growth proceeds perpendicular to the surface of the substrate. Therefore, in the ordinary irregular substrate which does not have a smooth surface, it is difficult to prevent defects from occurring due to collision of crystal grains. However, in the first electrode of the photovoltaic device according to the present invention, projections are interspersedly present, and the region other than the projections is smooth or substantially smooth, and thus the occurrence of defects can be prevented.

Consequently, the photovoltaic device of the present invention has a higher open-circuit voltage and a higher fill factor than the photovoltaic device including the ordinary irregular substrate. Furthermore, since the number of irregularities on the surface of the first electrode is small, the photovoltaic device of the present invention has the following three advantages:

1) The increase in the length of the optical path within the first electrode can be suppressed.
2) The reflection at the surface of the first electrode is increased.
3) Light trapping in the first electrode can be reduced. Because of these advantages, the photovoltaic device of the present invention can absorb light effectively.

Furthermore, the lower limit and the upper limit of the projection density suitably satisfy the following equations, provided that the thickness of the second-conductivity-type layer is t μm:

Lower limit=0.312 exp(−0.60t) pieces/μm²

Upper limit=0.387 exp(−0.39t) pieces/μm²

By setting the projection density within the range described above, the crystallinity of the second-conductivity-type layer can be improved. The way to derive the equations and the like will be described in details below in the examples.

In a method for fabricating a photovoltaic device according to an exemplary embodiment of the present invention, a first-conductivity-type layer and a second-conductivity-type layer are formed by plasma CVD on a first electrode such as that described above. In the method for fabricating the photovoltaic device according to the exemplary embodiment of the present invention, the contact surface between the second electrode and the third-conductivity-type layer has a plurality of curved convex portions. The contact surface between the second-conductivity-type layer, which is a hydrogenated polycrystalline silicon layer, and the third-conductivity-type layer also has a plurality of curved convex portions. However, even if a hydrogenated polycrystalline silicon layer is formed on the conventional first electrode using plasma CVD, without using the first electrode which is the feature of the present invention, the same surface morphology is not obtained. The reason for this is considered to be related to the fact that when a hydrogenated polycrystalline silicon layer is formed by plasma CVD, the (110) plane grows perpendicular to the first electrode. However, the mechanism thereof is unknown. The hydrogenated polycrystalline silicon that can be used in the present invention is formed at relatively low temperatures, and more specifically at 350° C. or lower. Thus, most of the grain boundaries are terminated with hydrogen. Consequently, the number of defects, such as dangling bonds, is very small, and recombination of carriers is suppressed.

The third-conductivity-type layer has a conductivity type opposite to that of the first-conductivity-type layer. As the third-conductivity-type layer, hydrogenated amorphous silicon or hydrogenated polycrystalline silicon can be used. In order to form the third-conductivity-type layer, RF plasma CVD or VHF plasma CVD is usually used. The thickness of the layer is usually 5 to 20 nm.

Each of the first-conductivity-type layer, the second-conductivity-type layer, and the third-conductivity-type layer may include a plurality of sublayers. For example, the third-conductivity-type layer may include a plurality of sublayers, and among the sublayers, a sublayer in contact with the second-conductivity-type layer may be a buffer layer composed of hydrogenated amorphous silicon. Furthermore, the first-conductivity-type layer may include a plurality of sublayers, and among the plurality of sublayers, a layer in contact with the second transparent conductive layer may be a buffer layer. In particular, when the sublayer in contact with the second transparent conductive layer is a buffer layer, even if the conductivity type of the buffer layer is different from the conductivity type of the rest of the first-conductivity-type layer, the buffer layer is considered to be a part of the first-conductivity-type layer in the present invention and in this specification. The thickness of the buffer layer can be about 10 nm.

As the material for the second electrode, a transparent material having high conductivity is used. Examples of such a material include ITO, ZnO, and SnO₂. In particular, ITO can be used. The second electrode can be formed by sputtering or vacuum deposition. The thickness of the second electrode can be set so as to prevent the reflection of light with a wavelength of 550 nm. The thickness of the second electrode is usually set at about 60 to 70 nm so that the first reflection prevention condition is obtained. In this exemplary embodiment, a transparent, high-conductivity electrode (transparent electrode) is used as the second electrode on the assumption that the second electrode is provided over the entire surface of the third-conductivity-type layer. However, when the third-conductivity-type layer is a layer, such as a highly doped silicon layer, that has sufficiently low resistivity, it is not necessary to provide the second electrode over the entire surface of the third-conductivity-type layer. In such a case, a collecting electrode that is provided partially on the surface of the third-conductivity-type layer can be used as the second electrode. Additionally, regardless of the level of resistivity of the third-conductivity-type layer, a transparent electrode and a collecting electrode may be used together as the second electrode.

In the method for fabricating the photovoltaic device according to the exemplary embodiment of the present invention, the contact surface between the second electrode and the third-conductivity-type layer has a plurality of curved convex portions. Consequently, the photovoltaic device of the present invention has the following three advantages:

4) The length of the optical path within the second-conductivity-type layer can be increased.

5) The reflection at the surface of the second electrode is decreased.

6) Light trapping in the second-conductivity-type layer can be increased.

Because of these advantages, the photovoltaic device of the present invention can absorb light effectively.

The collecting electrode 109 has a function of efficiently collecting the current due to the photovoltaic force generated, and has a comb-like shape when viewed from the direction of light incidence. The collecting electrode can be formed using a low-resistivity material, such as Ag, Cu, or Al, by sputtering, vacuum deposition, or the like. It may also be possible to form the collecting electrode by screen-printing of a conductive paste, such as a silver paste.

The exemplary embodiment of the method for fabricating the photovoltaic device which includes the first electrode, the first-conductivity-type layer, the second-conductivity-type layer, the third-conductivity-type layer, the second electrode, and the collecting electrode disposed in that order on the substrate has been described above. In the photovoltaic device, light enters from the second electrode toward the substrate. In this exemplary embodiment, the reflection layer is a part of the first electrode. In another exemplary embodiment of the present invention, the reflection layer may be a part of the second electrode. An example in which the reflection layer is a part of the second electrode is a photovoltaic device having a structure in which light enters from the substrate toward the second electrode. In this example, the first electrode, the first-conductivity-type layer, the second-conductivity-type layer, the third-conductivity-type layer, and the second electrode including the reflection layer are formed in that order on the substrate. In such a case, the light is transmitted through the substrate, the first electrode, the first-conductivity-type layer, the second-conductivity-type layer, and the third-conductivity-type layer in this order to reach the second electrode. Therefore, the substrate and the first electrode must be transparent. In any of the cases, the device may have a tandem structure (a structure in which a plurality of semiconductor junctions, such as pin junctions, are stacked in series). In the device having the tandem structure, a conductivity-type layer in contact with the first electrode is referred to as a first-conductivity-type layer, a conductivity-type layer in contact with the first-conductivity-type layer is referred to as a second-conductivity-type layer, and a conductivity-type layer in contact with a second electrode is referred to as a third-conductivity-type layer. Note that when a solar cell in which a part of light is transmitted (i.e., a see-through solar cell) is formed using the photovoltaic device of the present invention, the reflection layer is not provided.

EXAMPLES

Examples of the photovoltaic device of the present invention will be described below. However, it is to be understood that the present invention is not limited to the examples.

organic washing. A reflection layer composed of Ag with a thickness of 300 nm was formed on the washed substrate using DC magnetron sputtering. A first transparent conductive layer composed of ZnO with a thickness of 0.1 μm was formed on the reflection layer. The formation conditions are summarized in Table 1.

Subsequently, a second transparent conductive layer was formed by electrodeposition. First, a bath was filled with pure water, zinc nitrate and dextrin were added thereto so that the concentration of zinc nitrate was 0.1 mol/l and the concentration of dextrin was 0.1 g/l. The temperature was set at 83° C. When the temperature was stabilized, the substrate which had been subjected to the step of forming the first transparent conductive layer was immersed in the bath, and a positive voltage was applied to a counter electrode composed of a zinc plate which had been provided in the bath in advance. Adjustment was made so that the current density was 7 mA/cm$^2$. When the second transparent conductive layer composed of ZnO was formed with a thickness of 0.2 μm on the first transparent conductive layer, the power source was turned off, and thus the formation of the second transparent conductive layer was completed. Drying was performed adequately with a hot air dryer to remove the moisture in the second transparent conductive layer. Then, using an electron microscope, the projection density was counted to be 0.47 pieces/μm$^2$.

Subsequently, using RF plasma CVD and VHF plasma CVD, a first-conductivity-type layer, a second-conductivity-type layer, and a third-conductivity-type layer were formed while maintaining a vacuum in the same vacuum chamber. The formation conditions are summarized in Table 2.

TABLE 1

| | Material | Formation method | Thickness (nm) | Ar (cc) | Power (W) | Temperature (° C.) |
|---|---|---|---|---|---|---|
| Reflection layer | Ag | DC magnetron sputtering | 300 | 100 | 1,000 | 250 |
| First transparent layer | ZnO | DC magnetron sputtering | 100 | 100 | 1,000 | 200 |
| Second electrode layer | ITO | DC magnetron sputtering | 65 | 100 | 1,000 | 200 |

TABLE 2

| | Material | Formation method | Thickness (nm) | Gas flow | | | | | Pressure (Pa) | Frequency (MHz) | Power (W) | Temperature (° C.) |
|---|---|---|---|---|---|---|---|---|---|---|---|---|
| | | | | SiH$_4$ | H$_2$ | PH$_3$ | BF$_3$ | SiH$_4$ | | | | |
| First-conductivity-type layer | μc-Si:H | RF plasma CVD | 10 | 10 | 1,000 | 0.4 | | | 600 | 13.56 | 200 | 250 |
| Second-conductivity-type layer | μc-Si:H | VHF plasma CVD | 4,000 | 150 | 3,500 | | | 500 | 600 | 60 | 2,000 | 180 |
| Third-conductivity-type layer | μc-Si:H | RF plasma CVD | 5 | 15 | 9,000 | | 4 | | 600 | 13.56 | 2,000 | 150 |

Example 1

A photovoltaic device shown in FIG. 1 was fabricated by the procedure described below. A stainless steel substrate with a smooth surface having a size of 80 cm×30 cm and a thickness of 0.15 mm was subjected to acid washing and After the third-conductivity-type layer was formed, the shape of the cross-section of the third-conductivity-type layer was observed with an electron microscope. It was found that the surface of the third-conductivity-type layer had a plurality of curved convex portions as shown in FIG.

1. Subsequently, a second electrode composed of ITO was formed by DC magnetron sputtering on the third-conductivity-type layer. The shape of the cross-section of the second electrode was observed with an electron microscope. It was found that the second electrode had a plurality of curved convex portions as shown in FIG. 1. The formation conditions are shown in Table 1. Subsequently, the substrate on which the layers up to the second electrode had been formed was cut into test pieces each having a size of 5 cm×5 cm. A mask having a pattern of a comb-shaped electrode was placed on the second electrode of each test piece, and a collecting electrode with a thickness of 300 nm was formed by vacuum deposition. Thus, the fabrication of the photovoltaic devices in this example was completed. The solar cell properties of the photovoltaic devices were measured using a solar simulator. The average properties measured are shown in Table 3. When cut sections and their vicinities were observed with an electron microscope, the occurrence of layer separation was not found.

TABLE 3

| | Voc (V) | Jsc (mA/cm$^2$) | FF | Conversion efficiency (%) |
|---|---|---|---|---|
| Example 1 | 0.489 | 28.7 | 0.645 | 9.05 |
| Comparative Example 1 | 0.493 | 25.0 | 0.651 | 8.03 |
| Comparative Example 2 | 0.474 | 27.3 | 0.617 | 7.99 |

Comparative Example 1

Figure 4:
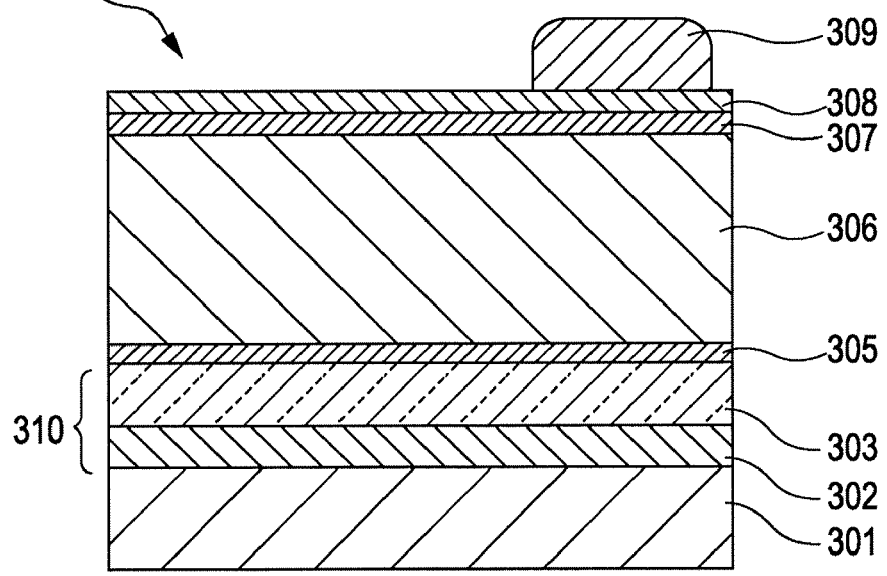
FIG. 4 is a schematic cross-sectional view showing an example of a conventional photovoltaic device.

A photovoltaic device (conventional type) shown in FIG. 4 was fabricated. Referring to FIG. 4, a conventional photovoltaic device 300 includes a substrate 301, a first electrode 310 which includes a reflection layer 302 and a first transparent conductive layer 303, a first-conductivity-type layer 305, a second-conductivity-type layer 306, a third-conductivity-type layer 307, a second electrode 308, and a collecting electrode 309. A photovoltaic device was fabricated as in Example 1 except that the second transparent conductive layer was not formed, and the measurement was conducted. The average properties measured are shown in Table 3. When the formation of the first transparent conductive layer 303 was completed, the surface thereof was observed with an electron microscope. It was found that the first transparent conductive layer 303 had a smooth surface as shown in FIG. 4. When the formation of the third-conductivity-type layer 307 and the second electrode 308 was completed, the shapes of the cross-sections of the third-conductivity-type layer 307 and the second electrode 308 were observed with an electron microscope. It was found that the third-conductivity-type layer 307 and the second electrode 308 had smooth surfaces as shown in FIG. 4. When the cut sections and their vicinities were observed with an electron microscope, it was found that layer separation occurred in 5 sheets out of 96 sheets.

Comparative Example 2

Figure 3:
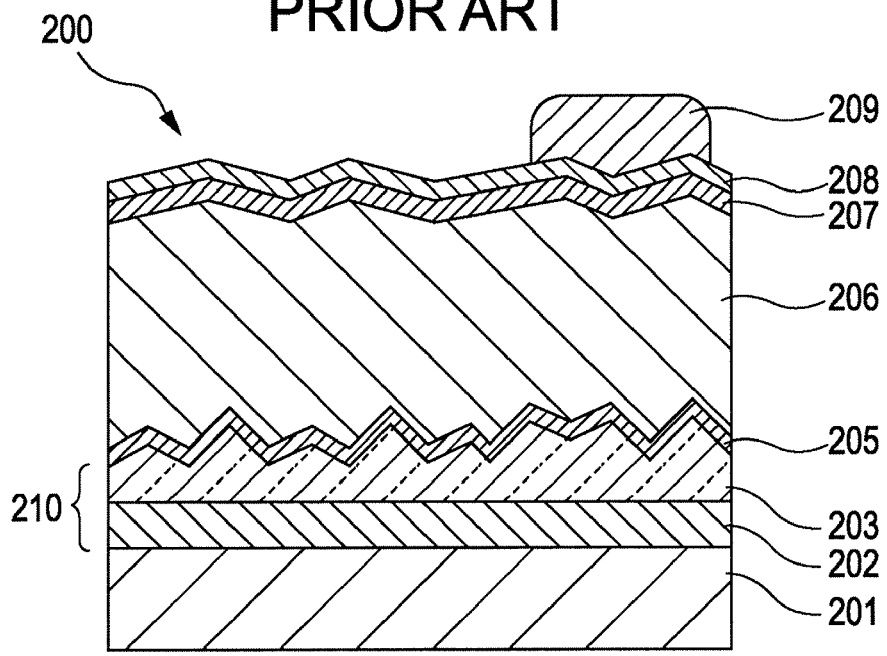
FIG. 3 is a schematic cross-sectional view showing an example of a conventional photovoltaic device.

A photovoltaic device (conventional type) shown in FIG. 3 was fabricated. Referring to FIG. 3, a conventional photovoltaic device 200 includes a substrate 201, a first electrode 210 which includes a reflection layer 202 and a first transparent conductive layer 203, a first-conductivity-type layer 205, a second-conductivity-type layer 206, a third-conductivity-type layer 207, a second electrode 208, and a collecting electrode 209. A photovoltaic device was fabricated as in Comparative Example 1 except that the thickness of the first transparent conductive layer was set at 1.0 μm and irregularities were formed densely on the surface thereof, and the measurement was conducted.

When the formation of the first transparent conductive layer 203 was completed, the surface thereof was observed with an electron microscope. It was found that the surface of the first transparent conductive layer 203 had an irregular shape without smooth portions, as was the case in the past, as shown in FIG. 3. When the formation of the third-conductivity-type layer 207 and the second electrode 208 was completed, the shapes of the cross-sections of the third-conductivity-type layer 207 and the second electrode 208 were observed with an electron microscope. It was found that the third-conductivity-type layer 207 and the second electrode 208 had cross-sectional shapes as shown in FIG. 3. That is, the surface of each of the third-conductivity-type layer 207 and the second electrode 208 did not have an irregular shape such as that of the first transparent conductive layer 203 and had a substantially smooth shape. When cut sections and their vicinities were observed with an electron microscope, the occurrence of layer separation was not found.

Table 3 shows the open-circuit voltage (Voc), short-circuit current density (Jsc), F.F. (fill factor), and conversion efficiency in Example 1 and Comparative Examples 1 and 2. The values in Table 3 are the averages of the measured values. As is evident from Table 3, improvement in Jsc and conversion efficiency is achieved compared with Comparative Examples 1 and 2. Furthermore, as a result of the measurement of spectral sensitivity, it has been found that the photovoltaic device in Example 2 has higher sensitivity than that of the photovoltaic device in Comparative Example 1 or 2 over the entire wavelength range. This is considered to be brought about by the optical advantages described above in items 1) to 6) above.

Experimental Example 1

In Example 1, many photovoltaic devices having second transparent conductive layers with various thicknesses were fabricated. The experimental results are shown in FIGS. 8A to 8D. As is evident from FIGS. 8A to 8D in association with FIGS. 5 and 6, when the thickness of the second transparent conductive layer formed by electrodeposition is small, the projection density on the first electrode is low. Thus, the number of irregularities on the surface is low, and although the open-circuit voltage and the fill factor are high, it is not possible to obtain sufficient light collection efficiency. When the thickness of the second transparent conductive layer is large, the projection density on the first electrode is high.

Thus, the number of irregularities on the surface is large, and it is not possible to obtain sufficient light collection efficiency. As a result, it has been found that in order to achieve sufficient light collection efficiency, the projection density must be in a certain range. In this experimental example, since the thickness of the second-conductivity-type layer was 4 μm, the suitable lower limit of the projection density was 0.25 pieces/μm$^2$ and the suitable upper limit of the projection density was 0.8 pieces/μm$^2$.

Experimental Example 2

The suitable relationship between the thickness of the second-conductivity-type layer and the projection density was investigated. As the method for changing the projection density, a method was employed in which in the process of forming the second transparent conductive layer, the electrodeposition conditions were changed at two stages. That is, when the second transparent conductive layer was formed, at the initial stage, the current density was set at 6 MA/cm$^2$, and when the thickness reached 5 nm, the density of the current applied was adjusted according to the desired projection density. When the projection density was desired to be increased, a large amount of current was applied. When the projection density was desired to be decreased, the amount of current was decreased.

Figure 9:
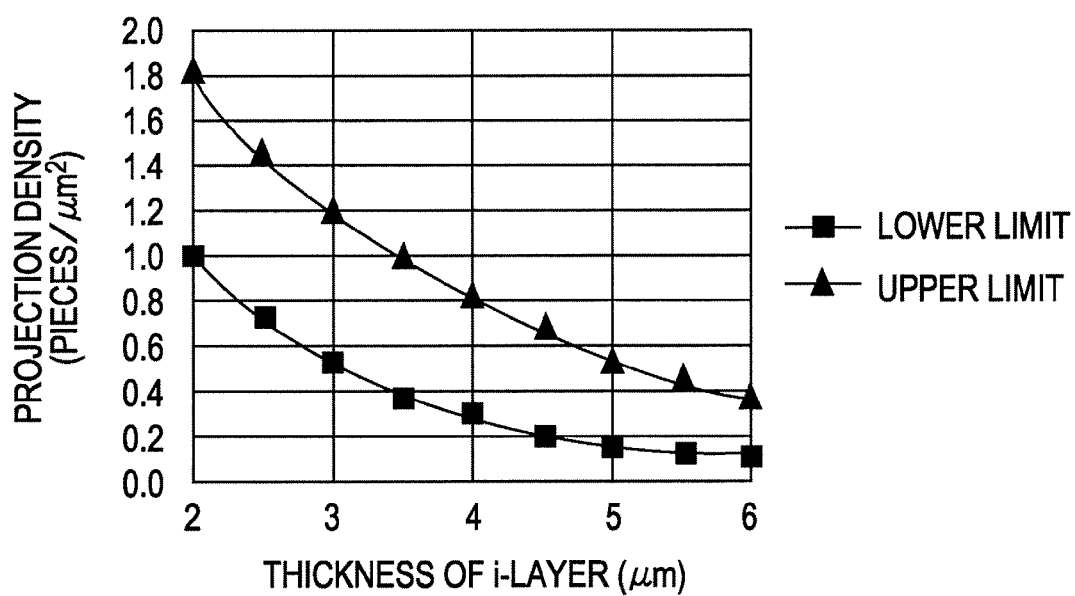
FIG. 9 is a graph showing the suitable relationship between the thickness of a second-conductivity-type layer and the projection density in terms of the upper limit and the lower limit.

FIG. 9 is a graph showing the suitable relationship between the thickness of the second-conductivity-type layer (i-layer) and the projection density. In the graph, at each thickness of the i-layer, the maximum of the conversion efficiency obtained when the projection density was changed was assumed to be 1, the range in which the projection density achieved a conversion efficiency of 0.95 or more was considered to be suitable. At each thickness of the i-layer, the lower limit and the upper limit of the projection density were plotted. Curve approximation was carried out from the plot, and thus the lower limit and the upper limit of the suitable range of the projection density was determined as follows, provided that the thickness of the second-conductivity-type layer was t μm:

Lower limit=0.312 exp(−0.60$t$) pieces/μm$^2$

Upper limit=0.387 exp(−0.39$t$) pieces/μm$^2$

Example 2

In Example 2, a photovoltaic device shown in FIG. 1 was fabricated as in Example 1 except that a buffer layer composed of hydrogenated amorphous silicon was disposed between the second-conductivity-type layer and the third-conductivity-type layer. The buffer layer was formed by RF plasma CVD at a frequency of 13.56 MHz, under the following conditions: SiH$_4$=30 cc, H$_2$=2,500 cc, RF power 200 W, pressure 600 Pa, substrate temperature 200° C., and thickness 10 nm. With respect to the average properties of the photovoltaic devices fabricated in this example, in comparison with the average properties of the photovoltaic devices fabricated in Example 1, the open-circuit voltage and the fill factor were improved, and the conversion efficiency was improved 1.05 times compared to that of the photovoltaic devices fabricated in Example 1. The shape of the cross section of the second electrode of the photovoltaic device fabricated in this example was observed with an electron microscope. As a result, a plurality of curved convex portions were found as shown in FIG. 1.

While the present invention has been described with reference to exemplary embodiments, it is to be understood that the invention is not limited to those embodiments. The scope of the following claims is to be accorded the broadest interpretation so as to encompass all modifications, equivalent structures and functions.

This application claims the benefit of Japanese Application No. 2005-239766 filed Aug. 22, 2005, which is hereby incorporated by reference herein in its entirety.

What is claimed is:

1. A photovoltaic device comprising:
   a first electrode;
   a first-conductivity-type layer composed of non-single-crystalline silicon;
   a second-conductivity-type layer composed of polycrystalline silicon;
   a third-conductivity-type layer composed of non-single-crystalline silicon; and
   a second electrode,
   wherein a contact surface of the first electrode with respect to the first-conductivity-type layer has a shape interspersed with a plurality of projections, and the lower limit and the upper limit of the density of the projections interspersed on the surface of the first electrode satisfy the following equations, provided that the thickness of the second-conductivity-type layer is t μm:

Lower limit=0.312 exp(−0.60$t$) pieces/μm$^2$

Upper limit=0.387 exp(−0.39$t$) pieces/μm$^2$.

2. The photovoltaic device according to claim 1, wherein a contact surface of the third-conductivity-type layer with respect to the second electrode has a plurality of curved convex portions.

3. The photovoltaic device according to claim 1 or 2, wherein the first electrode includes a reflection layer, a first transparent conductive layer, and a second transparent conductive layer, the second transparent conductive layer being in contact with the first-conductivity-type layer, the projections being present on the surface of the second transparent conductive layer.

4. The photovoltaic device according to claim 1 or 2, wherein the third-conductivity-type layer includes a plurality of sublayers, and among the plurality of sublayers, a sublayer in contact with the second-conductivity-type layer is a buffer layer composed of hydrogenated amorphous silicon.

5. The photovoltaic device according to claim 1 or 2, wherein the first electrode includes a layer composed of zinc oxide formed by electrodeposition.

* * * * *